(12) United States Patent
Sato

(10) Patent No.: US 8,570,078 B2
(45) Date of Patent: Oct. 29, 2013

(54) CDR CIRCUIT

(75) Inventor: Kiyohito Sato, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 13/425,347

(22) Filed: Mar. 20, 2012

(65) Prior Publication Data

US 2013/0076411 A1   Mar. 28, 2013

(30) Foreign Application Priority Data

Sep. 22, 2011   (JP) ................... 2011-207557

(51) Int. Cl.
*H03L 7/06*   (2006.01)
(52) U.S. Cl.
USPC ......................... 327/155; 327/165
(58) Field of Classification Search
None
See application file for complete search history.

(56) References Cited

U.S. PATENT DOCUMENTS 4,787,097 A * 11/1988 Rizzo ...................... 375/375
7,397,881 B2   7/2008 Yamazaki

FOREIGN PATENT DOCUMENTS

| JP | 08-331113 | 12/1996 |
|---|---|---|
| JP | 2010-219745 | 9/2010 |
| WO | WO 2004/054165 | 6/2004 |

* cited by examiner

*Primary Examiner* — Cassandra Cox
(74) *Attorney, Agent, or Firm* — Knobbe, Martens, Olson & Bear, LLP

(57) ABSTRACT

A CDR circuit includes a clock recovery circuit that generates, from an external clock, a first clock with which data of a received data signal is to be sampled and a second clock with which an edge of the received data signal is to be sampled and adjusts phases of the first clock and the second clock. The CDR circuit includes a phase detecting circuit that outputs a result of sampling of the received data signal with the first clock as a data sampling result and a result of sampling of the received data signal with the second clock as an edge sampling result. The CDR circuit includes a result comparing circuit that determines that a false lock condition has occurred and outputs a false lock condition detection signal if the edge sampling result matches with the data pattern.

19 Claims, 6 Drawing Sheets

NORMAL LOCK CONDITION

FALSE LOCK CNDITION

CDR CIRCUIT

CROSS-REFERENCE TO RELATED APPLICATION

This application is based upon and claims the benefit of priority from the prior Japanese Patent Application No. 2011-207557, filed on Sep. 22, 2011, the entire contents of which are incorporated herein by reference.

BACKGROUND

1. Field

Embodiments described herein relate generally to a Clock Data Recovery (CDR) CIRCUIT.

2. Background Art

Conventional CDR circuits used for fast serial data transmission can fall into a false lock condition because of the nature of their circuit characteristics.

DETAILED DESCRIPTION

A CDR circuit according to an embodiment includes a clock recovery circuit that generates, from an external clock, a first clock as a data sampling clock with which data of a received data signal is to be sampled and a second clock as an edge sampling clock with which an edge of the received data signal is to be sampled and adjusts phases of the first clock and the second clock. The CDR circuit includes a phase detecting circuit that outputs a result of sampling of the received data signal with the first clock as a data sampling result and a result of sampling of the received data signal with the second clock as an edge sampling result. The CDR circuit includes a result comparing circuit that compares the edge sampling result with a preset data pattern, and determines that a false lock condition has occurred and outputs a false lock condition detection signal if the edge sampling result matches with the data pattern.

The clock recovery circuit adjusts the phases of the first clock and the second clock based on the data sampling result and the edge sampling result.

The clock recovery circuit resets adjustment of the phases of the first clock and the second clock when the false lock condition detection signal is input to the clock recovery circuit.

Figure 1:
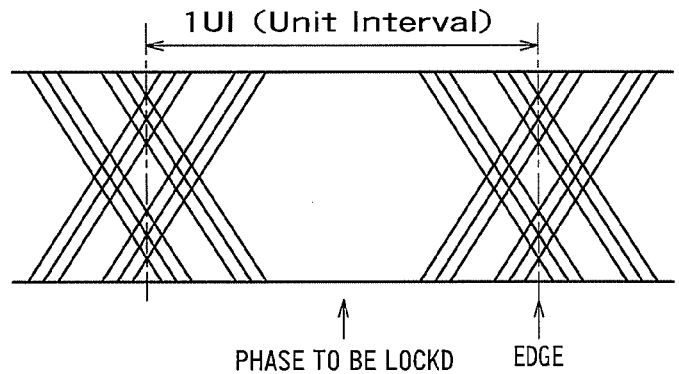
FIG. 1 is an eye pattern of a received data signal including a deterministic jitter, showing a phase to be locked.
Figure 2:
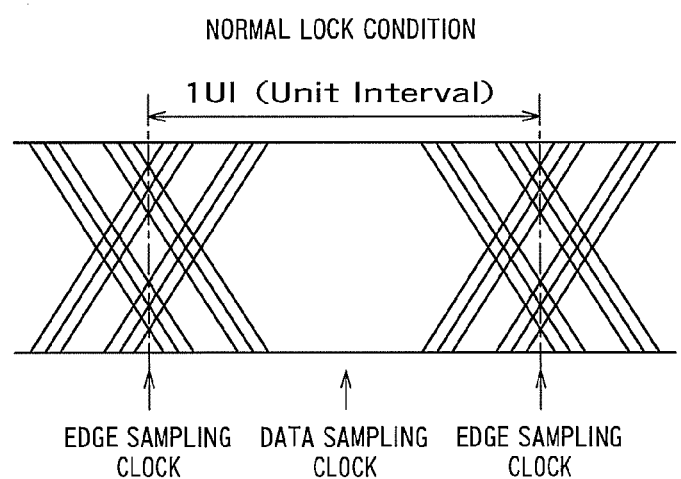
FIG. 2 is an eye pattern of a received data signal including a deterministic jitter, showing a normal lock condition.
Figure 3:
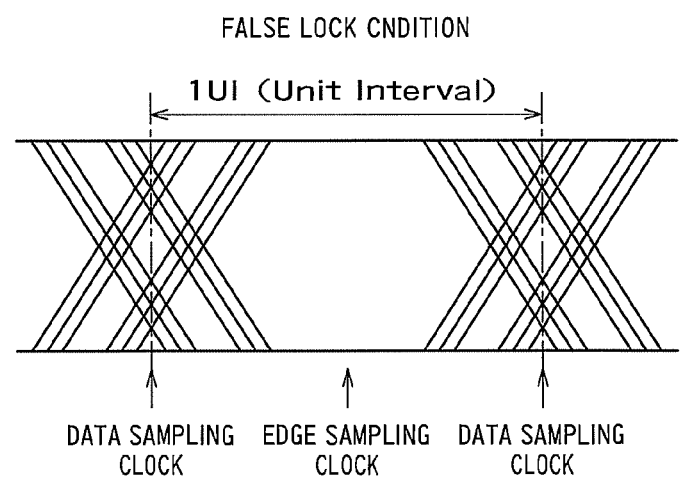
FIG. 3 is an eye pattern of a received data signal including a deterministic jitter, showing a false lock condition.

FIG. 1 shows an eye pattern of a received data signal including a deterministic jitter, showing a phase to be locked. FIG. 2 shows an eye pattern of a received data signal including a deterministic jitter, showing a normal lock condition. FIG. 3 shows an eye pattern of a received data signal including a deterministic jitter, showing a false lock condition.

As shown in FIG. 1, in the eye pattern of the received data signal including the deterministic jitter, a section corresponding to one unit interval (UI) is ideally locked.

That is, in the lock condition, the data sampling clock with which data is to be sampled is locked to the phase of the data of the data pattern, and the edge sampling clock with which an edge is to be sampled is locked to the phase of the edge of the data pattern (FIG. 2).

A CDR circuit incorporating a phase detecting circuit such as a binary phase detector has an advantage that it has a simple configuration. However, such a CDR circuit can only obtain phase information as to whether the phase is delayed or advanced that does not include the magnitude of a phase difference.

As a result, if the received data signal includes much deterministic jitters (Dj) such as inter-symbol interference (ISI), a condition in which a false phase is locked rather than a phase originally intended to be locked (a condition in which sampling with the data sampling clock occurs at a time during transition of the received data signal) can occur (FIG. 3). In the following, this condition will be referred to as a false lock condition. In the false lock condition, the data can be read out with the edge sampling clock, with which the edge would otherwise be sampled.

That is, it is possible that the CDR circuit in the false lock condition cannot properly read out data and cannot recover from the false lock condition.

To solve these problems, CDR circuits capable of detecting a false lock condition and recovering from the false lock condition will be proposed in the following description of embodiments.

In the following, the embodiments will be described with reference to the drawings.

(First Embodiment)

Figure 4:
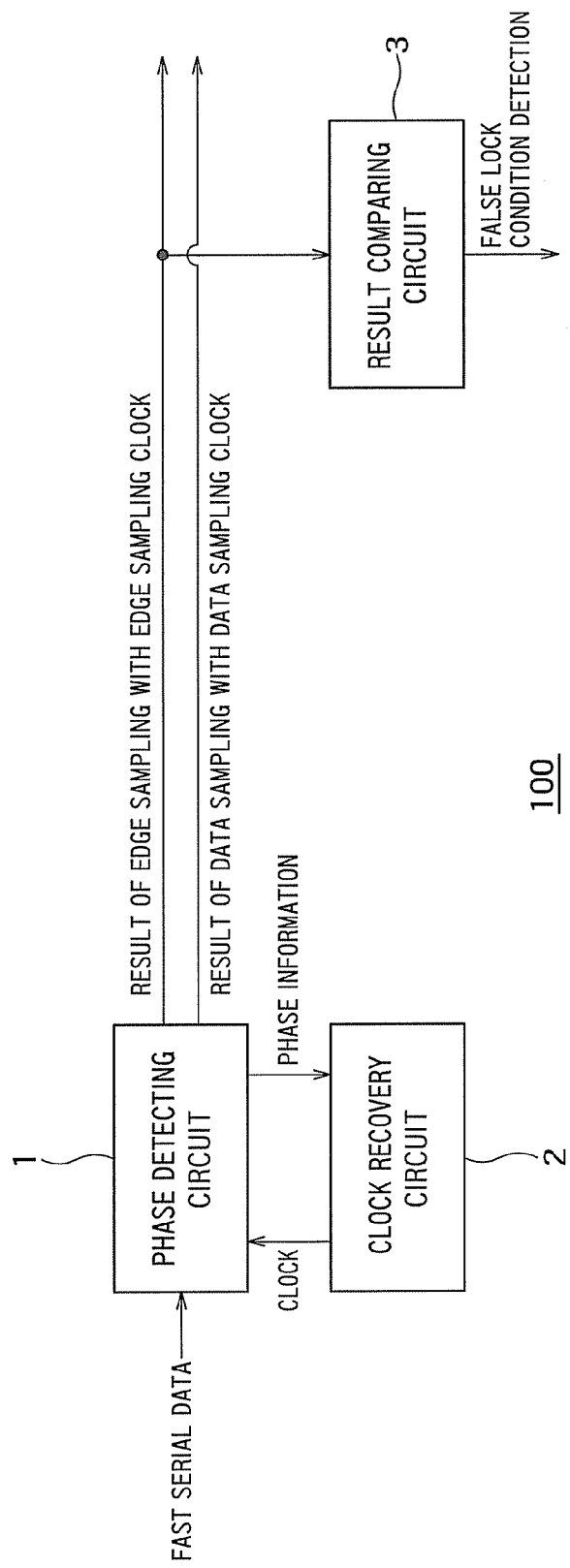
FIG. 4 is a diagram showing an example of a configuration of a CDR circuit 100 according to a first embodiment.

FIG. 4 is a diagram showing an example of a configuration of a CDR circuit 100 according to a first embodiment.

As shown in FIG. 4, the CDR circuit 100 is configured to output a received data signal (fast serial data encoded by an 8B10B encoder) sampled with a clock. The CDR circuit 100 is used for Peripheral Component Interconnect (PCI) Express, Serial Advanced Technology Attachment (SATA), or USB3.0 (Super Speed USB).

The CDR circuit 100 includes a phase detecting circuit 1, a clock recovery circuit 2, and a result comparing circuit 3.

The clock recovery circuit 2 is configured to generate, from an external clock (not shown), a first clock as a data sampling clock with which data of the received data signal is to be sampled and a second clock as an edge sampling clock with which an edge of the received data signal is to be sampled.

The clock recovery circuit 2 determines whether the phase of the first clock is delayed or advanced from the phase of the data of the received data signal based on the edge sampling result and the data sampling result (phase information) output from the phase detecting circuit 1. Then, based on the result of the determination, the clock recovery circuit 2 adjusts the phases of the first clock and the second clock so that the phase of the data of the received data signal is locked with the first clock (or the edge of the received data signal is locked with the second clock).

The edge of the received data signal and the data to be locked are shifted in phase from each other by a half period, for example. Therefore, the second clock is set to be shifted in phase from the first clock by a half period, for example.

The phase detecting circuit 1 is configured to output the result of sampling of the received data signal with the first clock as the data sampling result and the result of sampling of the received data signal with the second clock as the edge sampling result.

The result comparing circuit 3 is configured to compare the edge sampling result with a preset data pattern, and determine that the false lock condition has occurred and output a false lock condition detection signal if the edge sampling result matches with the data pattern. On the other hand, when the result comparing circuit 3 compares the edge sampling result with the data pattern, if the edge sampling result does not match with the data pattern, the result comparing circuit 3 determines that the false lock condition has not occurred and does not output the false lock condition detection signal.

The data pattern is a data pattern obtained by sampling the data of the received data signal in a lock condition. In particular, the data pattern is COMMA or K28.5, for example. The data pattern is previously stored in the result comparing circuit 3.

In general, the CDR circuit receives a known data pattern (that depends on the application) in a lock period. Therefore, it can be determined that the false lock condition has occurred if the result of sampling of the edge matches with the known data pattern.

The false lock condition detection signal output from the result comparing circuit 3 is used in a subsequent signal processing or the like or used for a controlled recovery from the false lock condition as in an embodiment described later.

Next, an example of an operation of the CDR circuit 100 configured as described above detecting the false lock condition will be described.

First, the clock recovery circuit 2 generates, from an external clock (not shown), the first clock as the data sampling clock with which the data of the received data signal is to be sampled and the second clock as the edge sampling clock with which the edge of the received data signal is to be sampled.

Then, the phase detecting circuit 1 outputs the result of sampling of the received data signal with the first clock as the data sampling result and the result of sampling of the received data signal with the second clock as the edge sampling result.

Then, the result comparing circuit 3 compares the edge sampling result output from the phase detecting circuit 1 with the preset data pattern, and determines that the false lock condition has occurred and outputs the false lock condition detection signal if the edge sampling result matches with the data pattern.

In this way, the CDR circuit 100 detects the false lock condition.

As described above, the CDR circuit according to the first embodiment can detect the false lock condition.

(Second Embodiment)

In the above first embodiment, an example of the configuration of the CDR circuit that detects the false lock condition has been described.

In a second embodiment, an example of a configuration of a CDR circuit that detects a false lock condition and recovers from the false lock condition will be described.

Figure 5:
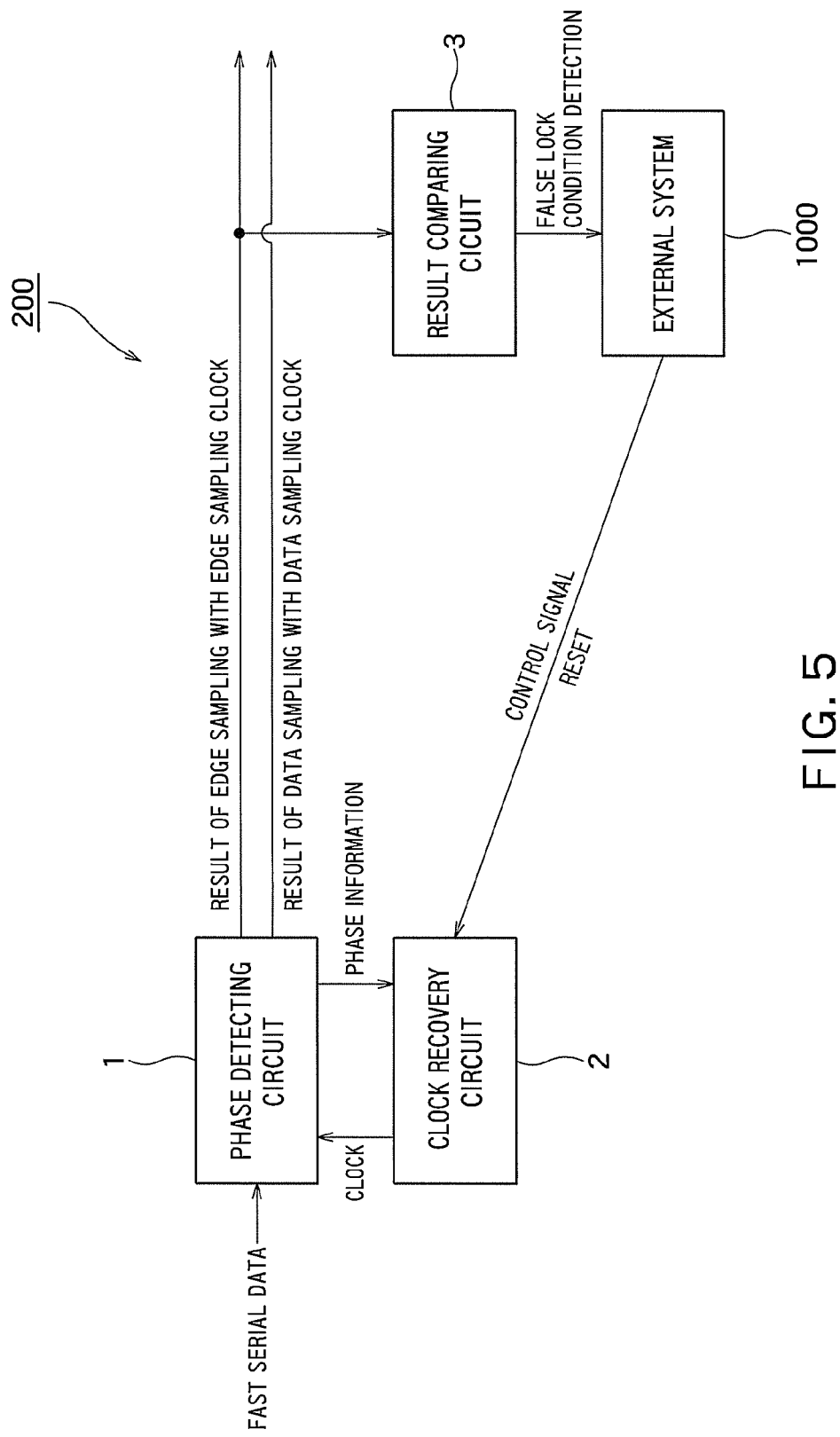
FIG. 5 is a diagram showing an example of a configuration of a CDR circuit 200 according to the second embodiment.

FIG. 5 is a diagram showing an example of a configuration of a CDR circuit 200 according to the second embodiment. In FIG. 5, the same reference numerals as those in FIG. 4 denote the same components as those in the first embodiment.

As shown in FIG. 5, the CDR circuit 200 includes the phase detecting circuit 1, the clock recovery circuit 2, and the result comparing circuit 3, as in the first embodiment.

As in the first embodiment, the result comparing circuit 3 is configured to compare the edge sampling result with the preset data pattern, and determine that the false lock condition has occurred and output the false lock condition detection signal if the edge sampling result matches with the data pattern.

An outside external system 1000 is configured to output a control signal to the clock recovery circuit 2 in response to the false lock condition detection signal.

According to this embodiment, the clock recovery circuit 2 is configured to reset the adjustment of the phases of the first clock and the second clock in response to input of the control signal output from the outside external system in response to the false lock condition detection signal. That is, when the clock recovery circuit 2 is reset, the clock recovery circuit 2 is configured to output the first and second clocks generated from the external clock (not shown) without adjusting the phases of the first and second clocks.

The remainder of the configuration of the CDR circuit 200 according to the second embodiment is the same as the CDR circuit 100 according to the first embodiment.

Next, an example of an operation of the CDR circuit 200 configured as described above will be described.

For example, the result comparing circuit 3 compares the edge sampling result with the preset data pattern, and determines that the false lock condition has occurred and outputs the false lock condition detection signal if the edge sampling result matches with the data pattern.

In response to the false lock condition detection signal, the outside external system 1000 outputs the control signal to the clock recovery circuit 2.

In response to input of the control signal output from the outside external system in response to the false lock condition detection signal, the clock recovery circuit 2 resets the adjustment of the phases of the first clock and the second clock.

Then, again based on the edge sampling result and the data sampling result (phase information) output from the phase detecting circuit 1, the clock recovery circuit 2 determines whether the phase of the first clock is delayed or advanced from the phase of the data of the received data signal.

Then, based on the result of the determination, the clock recovery circuit 2 adjusts the phases of the first clock and the second clock so that the phase of the data of the received data signal is locked with the first clock (or the edge of the received data signal is locked with the second clock).

In this way, when the false lock condition is detected, the CDR circuit 200 resets the clock recovery circuit 2 and makes the clock recovery circuit 2 perform locking again.

In this way, the CDR circuit 200 can recover from the false lock condition.

As described above, the CDR circuit according to the second embodiment can detect the false lock condition and recover from the false lock condition.

(Third Embodiment)

In the above second embodiment, an example of the configuration of the CDR circuit that recovers from the false lock condition by resetting the operation of the clock recovery circuit in response to the control signal output from the external system has been described.

In a third embodiment, an example of a configuration of a CDR circuit that recovers from the false lock condition by resetting the operation of the clock recovery circuit in response to the false lock condition detection signal output from the result comparing circuit will be described.

Figure 6:
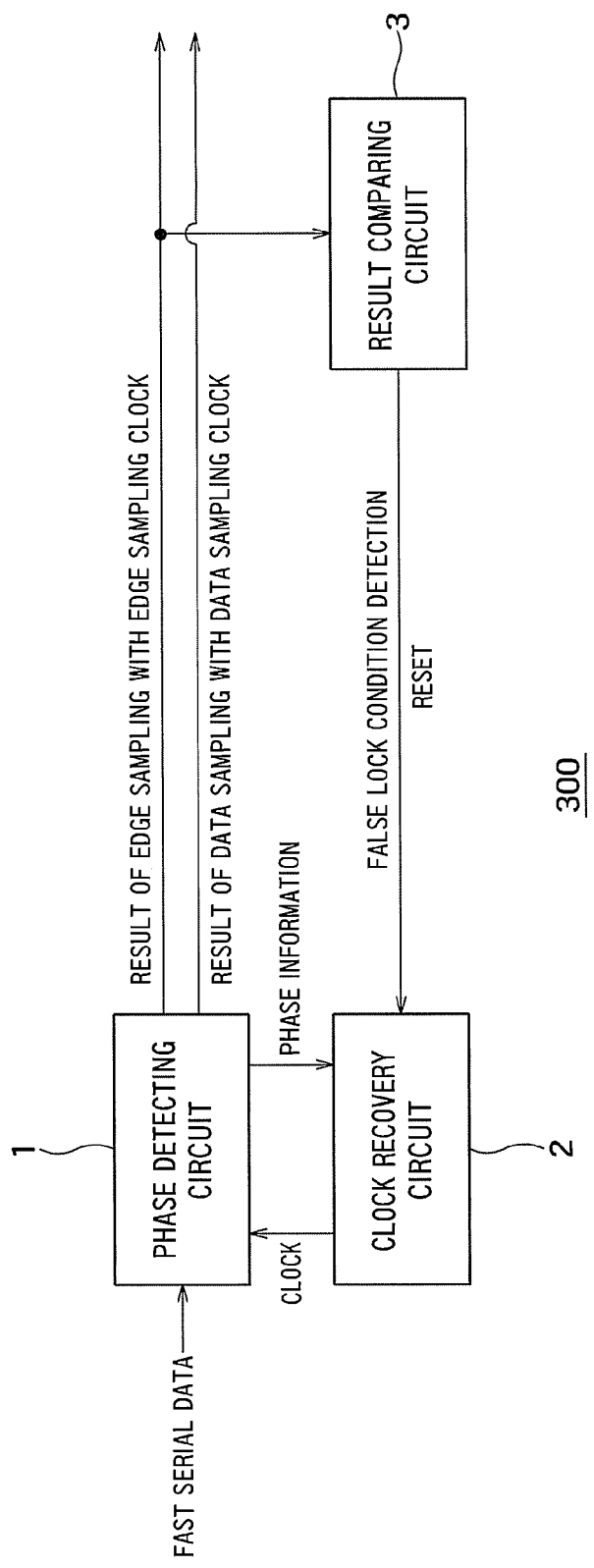
FIG. 6 is a diagram showing an example of a configuration of a CDR circuit 300 according to the third embodiment.

FIG. 6 is a diagram showing an example of a configuration of a CDR circuit 300 according to the third embodiment. In FIG. 6, the same reference numerals as those in FIG. 5 denote the same components as those in the second embodiment.

As shown in FIG. 6, the CDR circuit 300 includes the phase detecting circuit 1, the clock recovery circuit 2, and the result comparing circuit 3, as in the second embodiment.

As in the second embodiment, the result comparing circuit 3 is configured to compare the edge sampling result with the preset data pattern, and determine that the false lock condition has occurred and output the false lock condition detection signal if the edge sampling result matches with the data pattern.

According to this embodiment, the false lock condition detection signal is input directly to the clock recovery circuit 2. In response to input of the false lock condition detection signal, the clock recovery circuit 2 resets the adjustment of the phases of the first clock and the second clock. That is, when the clock recovery circuit 2 is reset, the clock recovery circuit 2 is configured to output the first and second clocks generated from the external clock (not shown) without adjusting the phases of the first and second clocks.

The remainder of the configuration of the CDR circuit 300 according to the third embodiment is the same as the CDR circuit 100 according to the first embodiment.

Next, an example of an operation of the CDR circuit 300 configured as described above will be described.

For example, the result comparing circuit 3 compares the edge sampling result with the preset data pattern, and determines that the false lock condition has occurred and outputs the false lock condition detection signal if the edge sampling result matches with the data pattern.

When the false lock condition detection signal is input to the clock recovery circuit 2, the clock recovery circuit 2 resets the adjustment of the phases of the first clock and the second clock.

Then, again based on the edge sampling result and the data sampling result (phase information) output from the phase detecting circuit 1, the clock recovery circuit 2 determines whether the phase of the first clock is delayed or advanced from the phase of the data of the received data signal.

Then, based on the result of the determination, the clock recovery circuit 2 adjusts the phases of the first clock and the second clock so that the phase of the data of the received data signal is locked with the first clock (or the edge of the received data signal is locked with the second clock).

In this way, when the false lock condition is detected, the CDR circuit 300 resets the clock recovery circuit 2 and makes the clock recovery circuit 2 perform locking again as in the second embodiment.

In this way, the CDR circuit 300 can recover from the false lock condition.

As described above, the CDR circuit according to the third embodiment can detect the false lock condition and recover from the false lock condition.

(Fourth Embodiment)

In the above second and third embodiments, examples of the configurations of the CDR circuits that recover from the false lock condition by resetting the operation of the clock recovery circuit have been described.

In a fourth embodiment, an example of a configuration of a CDR circuit that recovers from the false lock condition by interchanging the first clock and the second clock (that is, interchanging the data sampling clock and the edge sampling clock) will be described.

Figure 7:
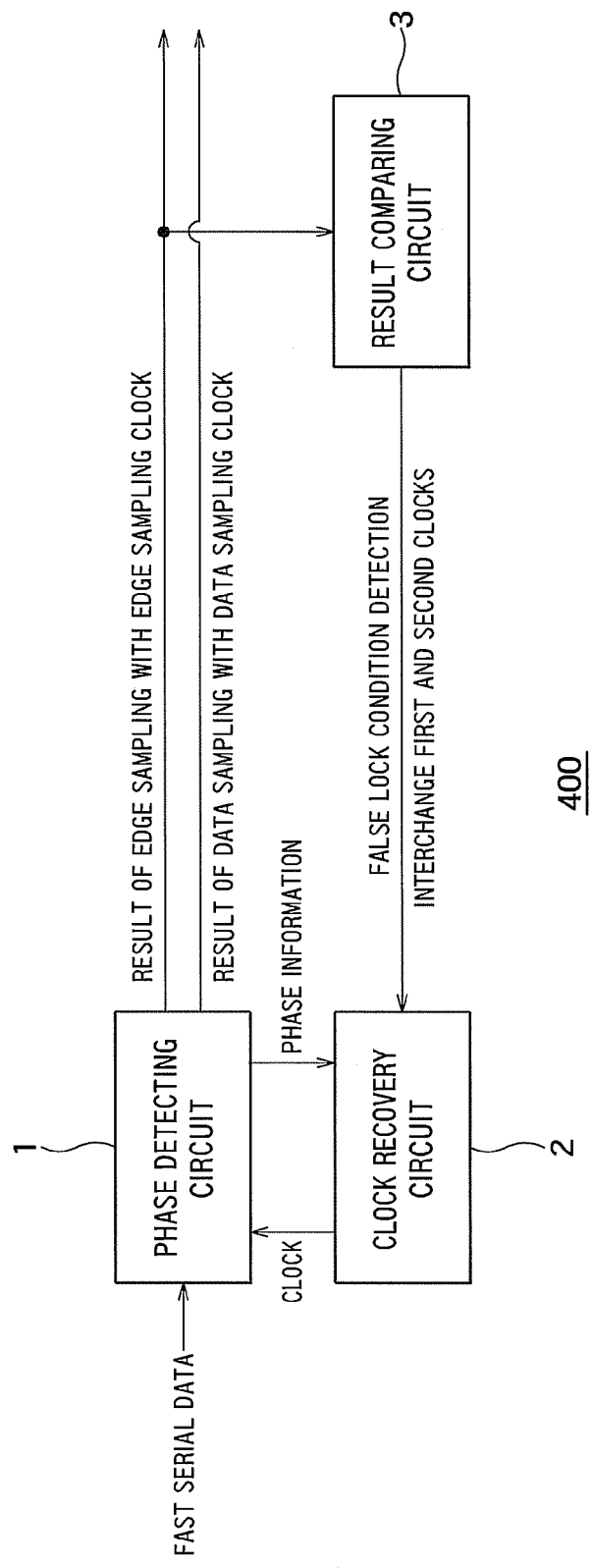
FIG. 7 is a diagram showing an example of a configuration of a CDR circuit 400 according to the fourth embodiment.

FIG. 7 is a diagram showing an example of a configuration of a CDR circuit 400 according to the fourth embodiment. In FIG. 7, the same reference numerals as those in FIG. 6 denote the same components as those in the third embodiment.

As shown in FIG. 7, the CDR circuit 400 includes the phase detecting circuit 1, the clock recovery circuit 2, and the result comparing circuit 3, as in the third embodiment.

As in the third embodiment, the result comparing circuit 3 is configured to compare the edge sampling result with the preset data pattern, and determine that the false lock condition has occurred and output the false lock condition detection signal if the edge sampling result matches with the data pattern.

According to this embodiment, when the false lock condition detection signal is input to the clock recovery circuit 2, the clock recovery circuit 2 is configured to interchange the first clock and the second clock and output the first clock as the edge sampling clock and the second clock as the data sampling clock to the phase detecting circuit 1.

The remainder of the configuration of the CDR circuit 400 according to the fourth embodiment is the same as the CDR circuit 300 according to the third embodiment.

Next, an example of an operation of the CDR circuit 400 configured as described above will be described.

For example, the result comparing circuit 3 compares the edge sampling result with the preset data pattern, and determines that the false lock condition has occurred and outputs the false lock condition detection signal if the edge sampling result matches with the data pattern.

When the false lock condition detection signal is input to the clock recovery circuit 2, the clock recovery circuit 2 interchanges the first clock and the second clock and outputs the first clock as the edge sampling clock and the second clock as the data sampling clock to the phase detecting circuit 1.

Thus, the second clock in the false lock condition serves as the data sampling clock, and the first clock in the false lock condition serves as the edge sampling click.

Therefore, the phase detecting circuit 1 outputs the result of sampling of the received data signal with the second clock in the false lock condition as the data sampling result and the result of sampling of the received data signal with the first clock in the false lock condition as the edge sampling result.

In the false lock condition, since the data of the received data signal is sampled with the second clock, which would otherwise serve as the edge sampling clock, the second clock is used as the data sampling clock. In this way, the condition in which the data of the received data signal can be locked with the second clock as the data sampling clock, that is, the lock condition, can be brought about.

As described above, the CDR circuit 400 swaps the roles of the data sampling clock and the edge sampling clock when the CDR circuit 400 detects the false lock condition.

In this way, the CDR circuit 400 can recover from the false lock condition.

As described above, the CDR circuit according to the fourth embodiment can detect the false lock condition and recover from the false lock condition.

As an alternative, the clock recovery circuit 2 may interchange the first clock and the second clock in response to input of the control signal output from the outside external system in response to the false lock condition detection signal described in the second embodiment. In this case, the CDR circuit has the same effects and advantages.

(Fifth Embodiment)

In the above fourth embodiment, an example of the configuration of the CDR circuit that recovers from the false lock condition by the clock recovery circuit interchanging the first clock and the second clock has been described.

In a fifth embodiment, an example of a configuration of a CDR circuit that recovers from the false lock condition by the phase detecting circuit interchanging the first clock and the second clock will be described.

Figure 8:
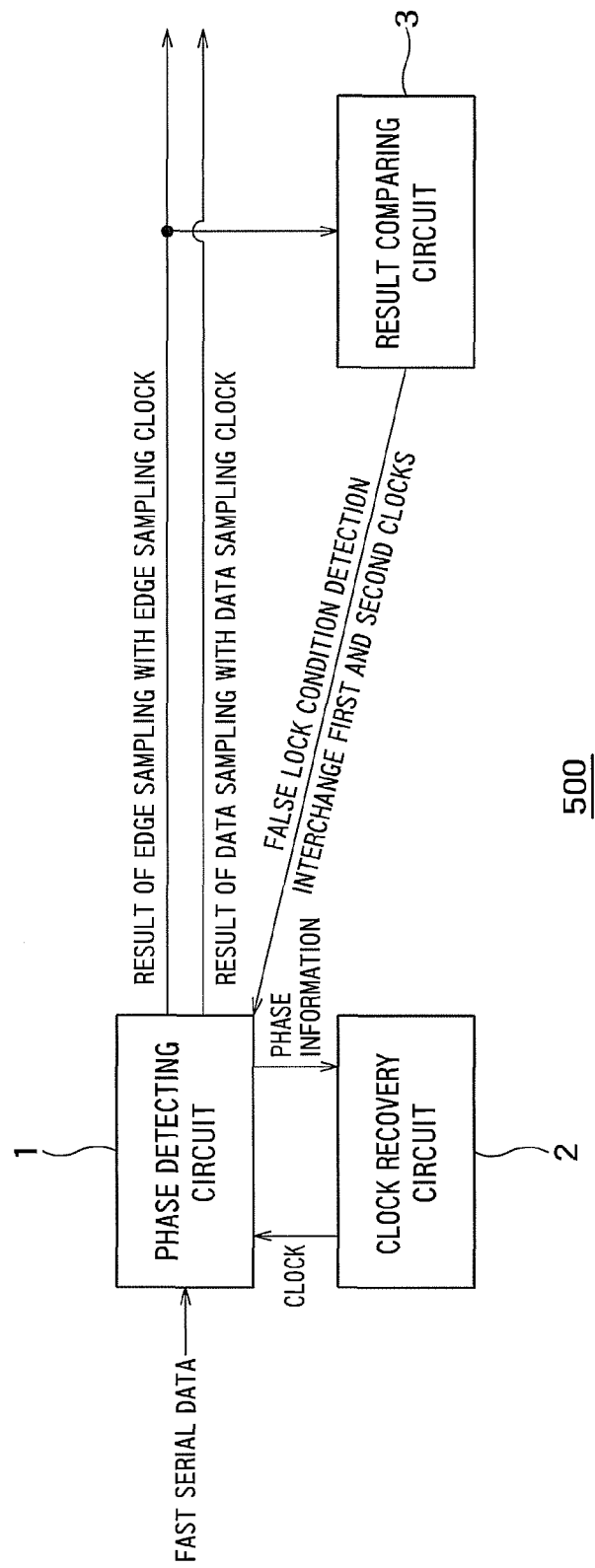
FIG. 8 is a diagram showing an example of a configuration of a CDR circuit 500 according to the fifth embodiment.

FIG. 8 is a diagram showing an example of a configuration of a CDR circuit 500 according to the fifth embodiment. In FIG. 8, the same reference numerals as those in FIG. 7 denote the same components as those in the fourth embodiment.

As shown in FIG. 8, the CDR circuit 500 includes the phase detecting circuit 1, the clock recovery circuit 2, and the result comparing circuit 3, as in the fourth embodiment.

As in the first embodiment, the result comparing circuit 3 is configured to compare the edge sampling result with the preset data pattern, and determine that the false lock condition has occurred and output the false lock condition detection signal if the edge sampling result matches with the data pattern.

The clock recovery circuit 2 is configured to generate, from the external clock (not shown), the first clock as the data sampling clock with which the data of the received data signal is to be sampled and the second clock as the edge sampling clock with which the edge of the received data signal is to be sampled.

When the false lock condition detection signal is input to the phase detecting circuit 1, the phase detecting circuit 1 is configured to interchange the first clock and the second clock and output the result of sampling of the received data signal with the second clock as the data sampling result and the result of sampling of the received data signal with the first clock as the edge sampling result.

The remainder of the configuration of the CDR circuit 500 according to the fifth embodiment is the same as the CDR circuit 400 according to the fourth embodiment.

Next, an example of an operation of the CDR circuit 500 configured as described above will be described.

For example, the result comparing circuit 3 compares the edge sampling result with the preset data pattern, and determines that the false lock condition has occurred and outputs the false lock condition detection signal if the edge sampling result matches with the data pattern.

The clock recovery circuit 2 generates, from the external clock (not shown), the first clock as the data sampling clock with which the data of the received data signal is to be sampled and the second clock as the edge sampling clock with which the edge of the received data signal is to be sampled.

In response to the false lock condition detection signal, the phase detecting circuit 1 interchanges the first clock and the second clock and outputs the result of sampling of the received data signal with the second clock as the data sampling result and the result of sampling of the received data signal with the first clock as the edge sampling result.

Thus, as in the fourth embodiment, the second clock serves as the data sampling clock, and the first clock serves as the edge sampling clock.

As described above, in the false lock condition, since the data of the received data signal is sampled with the second clock that would otherwise serve as the edge sampling clock, the second clock is used as the data sampling clock. In this way, the condition in which the data of the received data signal can be locked with the second clock as the data sampling clock can be brought about.

As described above, the CDR circuit 500 swaps the roles of the data sampling clock and the edge sampling clock when the CDR circuit 500 detects the false lock condition.

In this way, the CDR circuit 500 can recover from the false lock condition.

As described above, the CDR circuit according to the fifth embodiment can detect the false lock condition and recover from the false lock condition.

As an alternative, the phase detecting circuit 1 may interchange the first clock and the second clock in response to input of the control signal output from the outside external system in response to the false lock condition detection signal described in the second embodiment. In this case, the CDR circuit has the same effects and advantages.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A CDR circuit, comprising:
a clock recovery circuit that generates, from an external clock, a first clock as a data sampling clock with which data of a received data signal is to be sampled and a second clock as an edge sampling clock with which an edge of the received data signal is to be sampled and adjusts phases of the first clock and the second clock;
a phase detecting circuit that outputs a result of sampling of the received data signal with the first clock as a data sampling result and a result of sampling of the received data signal with the second clock as an edge sampling result; and
a result comparing circuit that compares the edge sampling result with a preset data pattern, and determines that a false lock condition has occurred and outputs a false lock condition detection signal if the edge sampling result matches with the data pattern,
wherein the clock recovery circuit
adjusts the phases of the first clock and the second clock based on the data sampling result and the edge sampling result, and
resets adjustment of the phases of the first clock and the second clock when the false lock condition detection signal is input to the clock recovery circuit.

2. The CDR circuit according to claim 1, wherein the clock recovery circuit
adjusts the phases of the first clock and the second clock based on the data sampling result and the edge sampling result so that phase of the data of the received data signal is locked with the first clock.

3. The CDR circuit according to claim 1, wherein the second clock is shifted in phase from the first clock by a half period.

4. The CDR circuit according to claim 1, wherein the clock recovery circuit
resets the adjustment of the phases of the first clock and the second clock in response to input of a control signal output from an external system in response to the false lock condition detection signal.

5. The CDR circuit according to claim 1, wherein the false lock condition is a condition in which sampling with the data sampling clock occurs at a time during transition of the received data signal.

6. The CDR circuit according to claim 1, wherein the CDR circuit is used for Peripheral Component Interconnect (PCI) Express, or Serial Advanced Technology Attachment (SATA).

7. The CDR circuit according to claim 1, wherein the data pattern is COMMA or K28.5.

8. A CDR circuit, comprising:
a clock recovery circuit that generates a first clock as a data sampling clock with which data of a received data signal is to be sampled and a second clock as an edge sampling clock with which an edge of the received data signal is to be sampled and adjusts phases of the first clock and the second clock;
a phase detecting circuit that outputs a result of sampling of the received data signal with the first clock as a data sampling result and a result of sampling of the received data signal with the second clock as an edge sampling result; and
a result comparing circuit that compares the edge sampling result with a preset data pattern, and determines that a false lock condition has occurred and outputs a false lock condition detection signal if the edge sampling result matches with the data pattern.

9. The CDR circuit according to claim 8, wherein the clock recovery circuit
interchanges the first clock and the second clock in response to the false lock condition detection signal and outputs the first clock as the edge sampling clock and the second clock as the data sampling clock to the phase detecting circuit, and
the phase detecting circuit
outputs a result of sampling of the received data signal with the second clock as the data sampling result and a result of sampling of the received data signal with the first clock as the edge sampling result.

10. The CDR circuit according to claim 8, wherein the phase detecting circuit
interchanges the first clock and the second clock in response to the false lock condition detection signal and outputs a result of sampling of the received data signal with the second clock as the data sampling result and a result of sampling of the received data signal with the first clock as the edge sampling result.

11. The CDR circuit according to claim 8, wherein the clock recovery circuit
adjusts the phases of the first clock and the second clock based on the data sampling result and the edge sampling result so that phase of the data of the received data signal is locked with the first clock.

12. The CDR circuit according to claim 8, wherein the result comparing circuit
determines that the false lock condition has not occurred and does not output the false lock condition detection signal if the edge sampling result does not match with the data pattern.

13. The CDR circuit according to claim 8, wherein the clock recovery circuit that generates, from an external clock, the first clock and the second clock.

14. The CDR circuit according to claim 8, wherein the second clock is shifted in phase from the first clock by a half period.

15. The CDR circuit according to claim 9, wherein the clock recovery circuit interchanges the first clock and the second clock in response to input of a control signal output from an outside external system in response to the false lock condition detection signal.

16. The CDR circuit according to claim 10, wherein the clock recovery circuit interchanges the first clock and the second clock in response to input of a control signal output from an outside external system in response to the false lock condition detection signal.

17. The CDR circuit according to claim 8, wherein the false lock condition is a condition in which sampling with the data sampling clock occurs at a time during transition of the received data signal.

18. The CDR circuit according to claim 8, wherein the CDR circuit is used for Peripheral Component Interconnect (PCI) Express, or Serial Advanced Technology Attachment (SATA).

19. The CDR circuit according to claim 8, wherein the data pattern is COMMA or K28.5.

* * * * *